United States Patent [19]

Adachi et al.

[11] Patent Number: 5,036,431
[45] Date of Patent: Jul. 30, 1991

[54] PACKAGE FOR SURFACE MOUNTED COMPONENTS

[75] Inventors: Kazumasa Adachi, Youro; Shinji Takahashi, Oogaki; Kimitaka Hirabayashi, Mino, all of Japan

[73] Assignee: Ibiden Co., Ltd., Japan

[21] Appl. No.: 393,013

[22] Filed: Aug. 11, 1989

Related U.S. Application Data

[63] Continuation of Ser. No. 163,777, Mar. 3, 1988, abandoned.

[51] Int. Cl.$^5$ .............................................. H05K 1/14
[52] U.S. Cl. .................................. 361/412; 361/396; 361/406; 361/414
[58] Field of Search .............. 174/524; 361/394, 396, 361/406, 408, 412, 413, 414

[56] References Cited

U.S. PATENT DOCUMENTS

| | | | |
|---|---|---|---|
| 3,323,022 | 5/1967 | DaCosta | 174/50.54 X |
| 3,730,969 | 5/1973 | Buttle et al. | 174/52.4 X |
| 3,805,117 | 4/1974 | Hausman | 361/412 X |
| 3,832,603 | 8/1974 | Cray et al. | 361/413 |
| 3,999,105 | 12/1976 | Archey et al. | 361/413 X |
| 4,082,394 | 4/1978 | Gedney et al. | 174/52 FP |
| 4,208,698 | 6/1980 | Narasimhan | 361/414 |
| 4,591,220 | 5/1986 | Impey | 361/414 X |
| 4,721,831 | 1/1988 | Vora | 174/68.5 |
| 4,729,061 | 3/1988 | Brown | 361/414 X |
| 4,736,521 | 4/1988 | Dohya | 174/68.5 X |
| 4,744,007 | 5/1988 | Watari et al. | 361/414 X |
| 4,754,371 | 6/1988 | Nitta et al. | 361/414 X |
| 4,803,450 | 2/1989 | Burgess et al. | 361/414 X |

FOREIGN PATENT DOCUMENTS 56-120147 9/1981 Japan .
59-195850 11/1984 Japan .
60-241244 11/1985 Japan .

OTHER PUBLICATIONS

Tomsa et al., Multilayer Laminated Chip Carrier, IBM Tech. Disc. Bull., Vol. 21, #4, Sep. 1978, pp. 1396 and 1397.

Primary Examiner—Gregory D. Thompson
Attorney, Agent, or Firm—Leydig, Voit & Mayer

[57] ABSTRACT

A package for surface-mounted components according to the present invention includes a first board which includes contact portions formed on a front face side thereof for mounting the components to be surface-mounted thereon, and first through-holes electrically contiguous with the contact portions; a second board includes conductor pins provided on a rear face side thereof for establishing continuity with another board and second through-holes electrically contiguous with the conductor pins; and a conductor layer interposed between the first and second boards by which the first through-holes in the first board side and the second through-holes in the second board side are mutually electrically connected.

10 Claims, 9 Drawing Sheets

PACKAGE FOR SURFACE MOUNTED COMPONENTS

This application is a continuation of application Ser. No. 07/163,777, filed Mar. 3, 1988.

BACKGROUND OF THE INVENTION

1. Field of the Invention

The present invention relates to an electronic component package, and more particularly to a package for surface-mounted components which carries the components to-be-surface-mounted, for example, general semiconductor components or digital IC's, on the upper face side thereof and which is installed on another circuit board or the like by conductor pins protruding from the lower side thereof.

2. Description of the Prior Art

Owing to the advancement of electronics in recent years, the density of integration of electronic components such as so-called semiconductor elements has become very high. It is only natural that the demand for high-density packaging for the higher density electronic components has increased. In order to cope with the high-density packaging of the electronic components various packaging techniques have been developed. However, in actuality packaging techniques capable of satisfactorily meeting the increased density of the electronic components is still in the course of development. In other words, high-density packaging technology is still behind the ever increasing densities in electronic components. In particular, recent electronic components have come to include large numbers of connection terminals and surface-mounting and packaging techniques employing conductor pins have been developed for coping with the large numbers of terminals.

As seen from, for example, Japanese Patent Application Laid-open No. 59-195850, there is a surface-mounting technique wherein an electronic component is received in a cap, with its connection terminals protruding from the side faces of the cap. The positions of the connection terminals correspond to patterns on a printed circuit board. The connection terminals of the electronic component are then directly connected to the patterns with solder or the like as they are placed on contact portions formed on the board. Thus, this surface-mounting technique has the advantages that the electronic component itself can be flatter and the board need not be subjected to any complicated working steps, e.g., the formation of contact holes for the electronic component. On the other hand, as a packaging technique employing conductor pins, there is, for example, the technique as seen in Japanese Patent Application Laid-open No. 60-241244. According to that publication patterns to be electrically connected to the individual conductor pins are formed so as to be concentrated around the electronic components to be packaged. This technique is suited to the packaging of electronic components which are small in size and which require protection such as resin encapsulation.

However, along with the merits of surface-mounted techniques, mentioned above, it is usually difficult to form external connection portions directly under a component to be surface-mounted. The reason is that the conductor circuit is covered by the surface-mounted components. As a result, the side under the surface-mounted component becomes, in effect, difficult to use. Accordingly, with this surface-mounting technique alone, it is difficult to achieve the high-density packaging explained before. Also, the mounting technique employing conductor pins is usually realized with a so-called pin-grid array, with the number of conductor pins equal to the number of terminals of the electronic component which is to be mounted. This equality makes it difficult to simultaneously mount a plurality of electronic components on the same pin-grid array. In particular, the conventional pin-grid array is commonly formed with a conductor circuit and conductor pins suitable for a single electronic component which is to be carried on the array. It can be readily understood, accordingly, that the pin-grid array suffices for packaging a specified electronic component, but that it is not versatile. In other words, conventional pin-grid arrays were designed and fabricated for the particular electronic component to be mounted, and the fabrication of the pin-grid arrays required a large amount of labor and much expense.

Further, so-called programmable IC's which can be programmed after mounting have recently been developed as a component that can be surface-mounted. Programmable IC's are of very high utility because circuits can be freely formed therein. However, a packaging circuit is necessary for a programmable IC, and by choosing a particular packaging circuit, the use of a programmable IC may be limited. In this regard, it would be very convenient if the packaging circuit could also be freely changed even after the corresponding programmable IC was mounted.

SUMMARY OF THE INVENTION

In view of the actual circumstances of the mounted technology as stated above, the inventors of the present invention made various studies on the electronic component packages of the specified type in order to develop a packaging technique capable of high-density packaging. The desired packaging can further advance the high-density implementation of the electronic component side. The inventors have completed the present invention upon finding that packaging at a still higher density can be accomplished by effectively utilizing the advantages of both the surface-mounting technique and the mounting technique employing conductor pins as described before.

The present invention has been made on the basis of the above circumstances, and one of the problems to be solved by invention is the insufficiently high densities in the prior art techniques for packaging electronic components.

Other problems solved by the present invention are enlargement in scale of the functional blocks of an electronic circuit, an increase in the number of conductor pins for a base printed wiring board, and the difficulty in tracing the operational situation of an electronic circuit.

Then, an object of the present invention is to provide a package for surface-mounted components which has a simple construction, which can sufficiently utilize and expand the prior art and which is capable of high-density packaging. In addition, a more concrete object of the present invention is to improve the versatility of a package for surface-mounted components by permitting high-density packaging.

A further concrete object of the present invention is to improve the versatility of a package for surface-mounted components by permitting circuit alterations even after the mounting of the components.

Still another object of the present invention is to provide a simply constructed package for surface-mounted components achieving an increased density, by securing the places for packaging the electronic components through the use of both long and short conductor pins.

Still another object of the present invention is to provide a package for surface-mounted components having a front face side which is provided with conductor pins for monitoring the programs and/or operations of the individual surface-mounted components.

Yet another object of the present invention is to skillfully utilize the merits of surface-mounting techniques and packaging techniques employing conductor pins for packages used for surface-mounted components, to thereby achieve packaging at a still higher density and to facilitate the handling of large scale electronic circuits as single blocks, a goal which cannot be realized by a single programmable IC.

DESCRIPTION OF THE PREFERRED EMBODIMENTS

Figure 1:
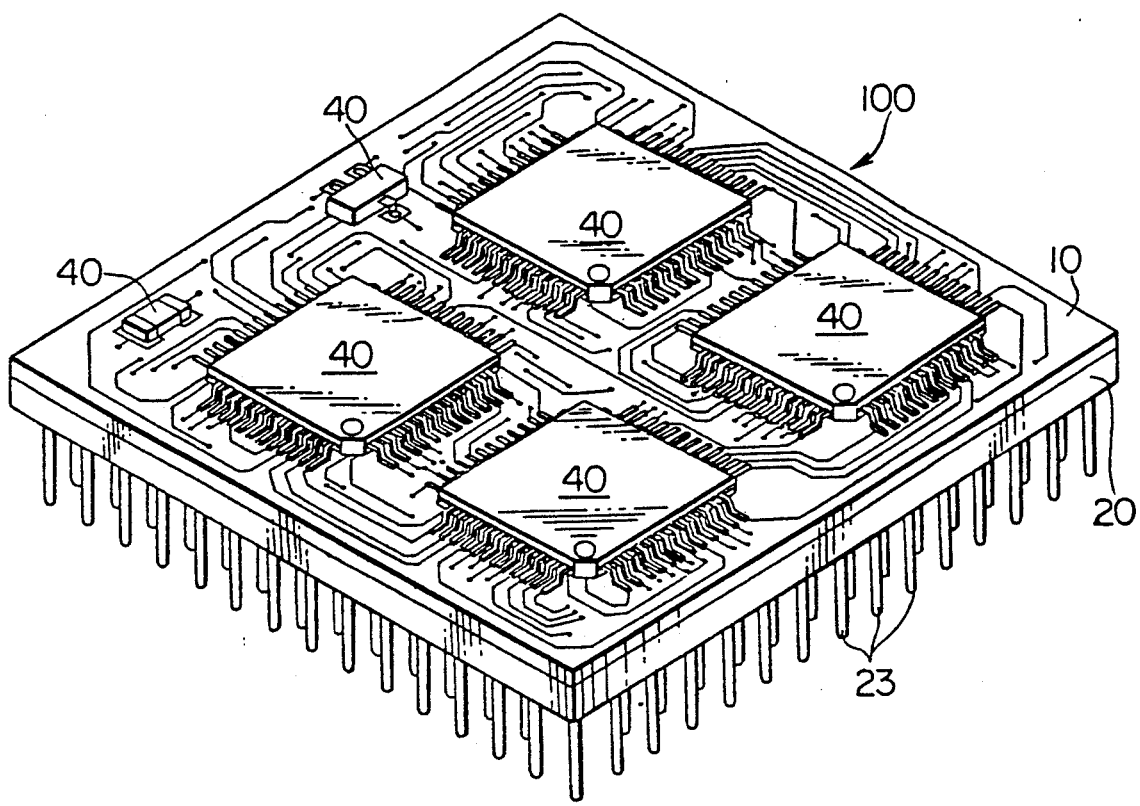
FIG. 1 is a perspective view of a first embodiment of the present invention.
Figure 2:
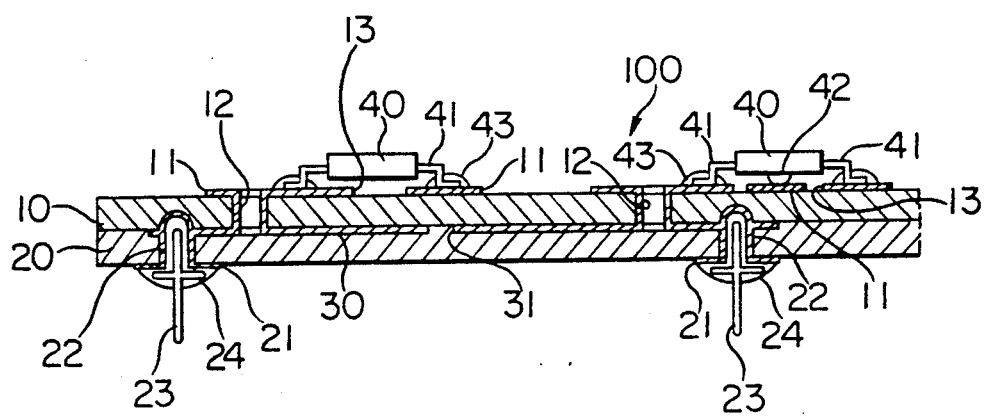
FIG. 2 is a sectional view of the first embodiment.

Embodiment 1:

FIG. 1 shows a perspective view of a package 100 for surface-mounted component in a first embodiment of the present invention, while FIG. 2 shows a sectional view of the first embodiment. The package 100 comprises a first board 10, on which four components 40 are surface-mounted, and a second board 20 which is disposed under the first board 10 integrally therewith, which has a large number of conductor pins 23. As shown in FIG. 2, the first board 10 and the second board 20 are integrated through a conductor layer 30 which includes insulating separations space 31. Conductor layer 30 is electrically connected with first through-holes 12 on the side of the first board 10 and with second through-holes 22 on the side of the second board 20.

The first board 10 is formed of a resinous material. As shown in FIG. 2, the upper face of the first board 10 is formed with a plurality of contact portions 11 for connecting the connection terminals 41 of the components to be surface-mounted 40. These contact portions 11 are formed in two types. The first type of contact portions 11 are electrically connected and contiguous with a corresponding one of a plurality of first through-holes 12 provided in appropriate places of the first board 10. The second type of contact portions 11 are made independent of the first through-holes 12 through insulating separations 13. Among the contact portions 11, there is a contact end portion 42 which is located under the surface-mounted component 40 lying on the right side as viewed in FIG. 2. Contact end portion 42 corresponds to the connection terminal 41 formed on the lower side of the surface-mounted component 40. The connection terminals 41 or the contact end portion 42 of the components 40 are arranged on and are electrically connected to the corresponding contact portions 11 with solder 43 or the like.

The second board 20 is formed of a resinous material and is integrally fastened to the lower face of the first board 10 by the use of an adhesive or the like. Also, as shown in FIG. 2, the second board 20 has land portions 21 including second through-holes 22. Each conductor pin 23 is integrally mounted in the corresponding second through-hole 22 with solder 24 or by means such as forced fitting.

The first board 10 and the second board 20 are integrally fixed to each other with the conductor layer 30 is held therebetween. The conductor layer 30 is electrically connected to both the first through-holes 12 on the side of the first board 10 and the second through-holes 22 on the side of the second board 20. Insulating spaces 31 are provided in necessary places, to thereby bring the connection terminals 41 or the contact end portion 42 of the individual surface-mounted components 40 and the individual conductor pins 23 into one-to-one correspondence.

Next, a method of fabricating the package 100 according to the present invention will be described with reference to FIGS. 3-6.

Figure 3:
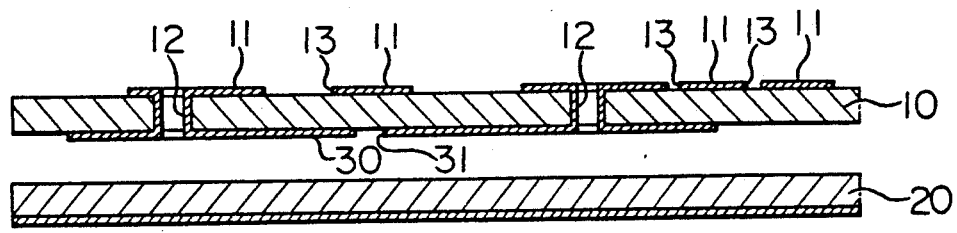
FIGS. 3-6 are views for explaining a process for fabricating the first embodiment.

First, both copper sheets of a double-sided copper-covered board, for example, are etched into predetermined configurations, to thereby form the contact portions 11 on the obverse side thereof and the conductor layer 30 on the reverse side thereof. Subsequently, the necessary first through-holes 12 are formed and are through-hole plated). Thus, the first board 10 shown in the upper portion of FIG. 3 is obtained. Further, the formation of the first through-holes 12 may be carried out before forming the contact portions 11. A single-sided copper-covered board 20 is arranged under the first board 10 with the single copper sheet thereof located away from first board 10. Both united with an adhesive or the like (refer to FIGS. 3 and 4).

Figure 4:
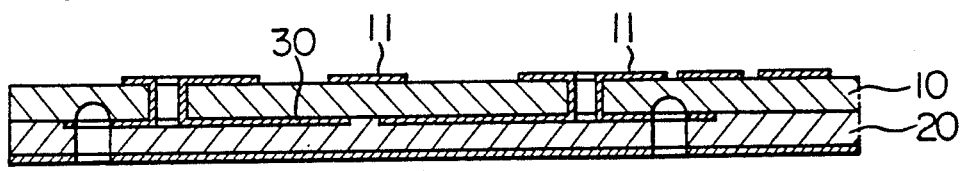
Figure 5:
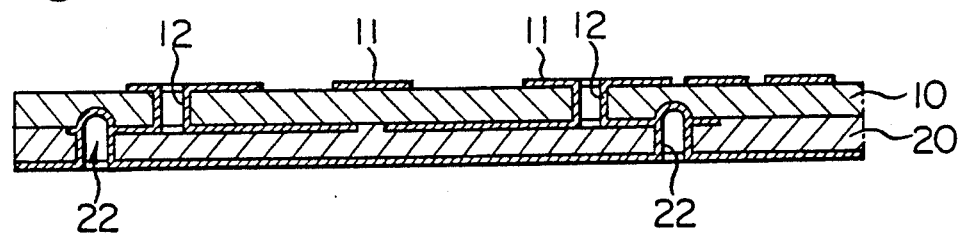
Figure 6:
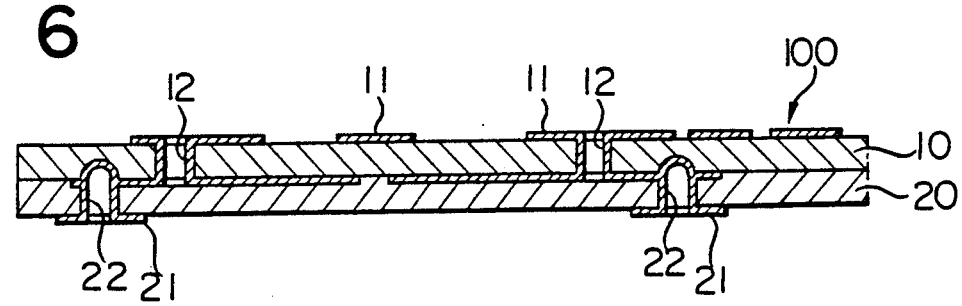

Next, recesses that become the second through-holes 22 are provided as shown in FIG. 4, and are through-hole plated as shown in FIG. 5. Subsequently, the copper sheet of the single-sided, copper-covered board is etched to leave parts corresponding to the second through-holes 22 and thereby form the land portions 21 (refer to FIGS. 5 and 6).

Thereafter, the conductor pins 23 are inserted into the respective second through-holes 22 and are fixed with solder 24 or the like. Thus, the package 100 as shown in FIG. 2 is finished. After the package 100 has been prepared, the connection terminals 41 or the contact end portions 42 of the components to be surface-mounted 40 are connected to the contact portions 11 with solder 43 or the like, thus completing the product shown in FIG. 1.

Needless to say, the provision of the recesses and the through-hole plating thereof as illustrated in FIGS. 4 and 5 may be carried out before the step of FIG. 3.

The package 100 in the first embodiment thus constructed has a number of advantages for surface-mounting techniques. A flat component can be used as the electronic component to be mounted and the boards need not be subjected to any working requiring complicated steps such as the formation of contact holes for the electronic component. At the same time, the package 100 can efficiently realize the advantages of packaging techniques employing conductor pins where external connection terminals for the individual components 40 do not need to be formed on the front face side of the package, allowing the front face side to be smoother.

Also, with the package 100, it is possible to use each conductor pin 23 in a shared fashion. Further, high-density packaging is possible, so that the versatility of the package is very high.

Embodiment 2

Figure 7:
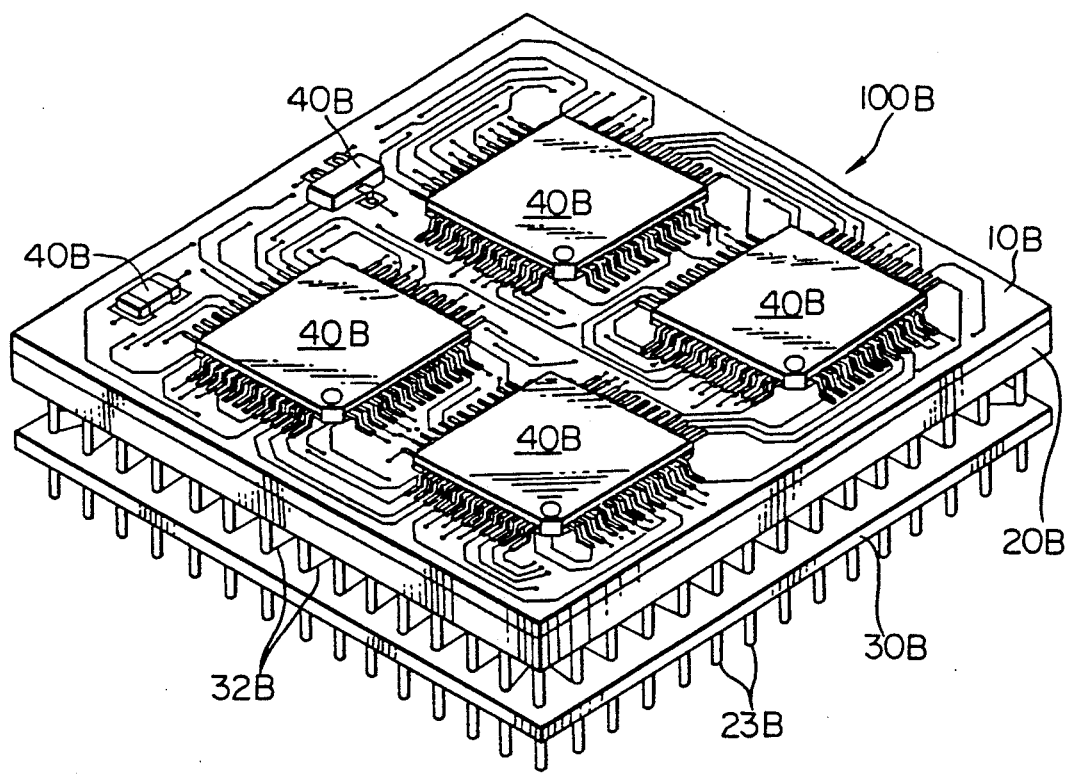
FIG. 7 and FIGS. 8 and 9 are a perspective view and sectional views of a second embodiment of the present invention, respectively.
Figure 8:
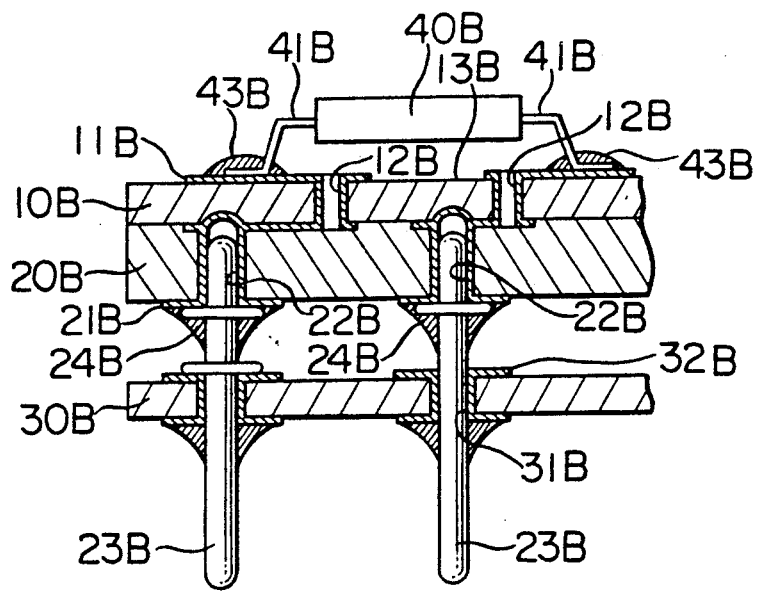
Figure 9:
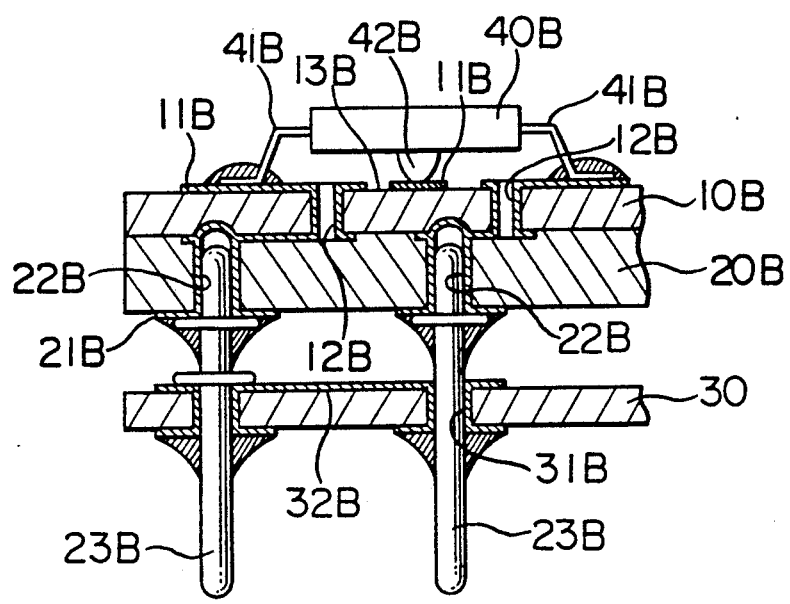

FIG. 7 shows a perspective view of a package 100B for surface-mounted components in a second embodiment of the present invention. FIGS. 8 and 9 show sectional views of the second embodiment. The package 100B comprises a first board 10B on which four components 40B are surface-mounted, a second board 20B which is disposed under the first board 10B integrally therewith and which has a large number of conductor pins 23B. A third board 30B is supported under the second board 20B by the conductor pins 23B. In the first board 10B and the second board 20B, as illustrated in FIG. 8, first through-holes 12B of the first board 10B and second through-holes 22B of the second board 20B are electrically connected, whereby contact portions 11B and the conductor pins 23B are held in one-to-one correspondence. The individual conductor pins 23B are either electrically independent of each other (as in FIG. 8) or are electrically connected to each other (as in FIG. 9) by a conductor layer 32B formed on the third board 30B.

The first board 10B is formed of a resinous material. As shown in FIG. 8, the front face of the first board 10B is formed with the plurality of contact portions 11B for connecting the connection terminals 41B of the components 40B. These contact portions 11B are formed in two types: contacts which are electrically connected and contiguous with a corresponding one of a plurality of first through-holes 12B in the first board 10B; and other contacts which are independent of the first through-holes 12B by means of corresponding insulating separations 13B. Among the contact portions 11B, there is a contact end portion 42B which is located under the surface-mounted component 40B lying on the upper side of the first board 10B as viewed in FIG. 9. This contact end portion 42B corresponds to the connection terminal 41B formed on the lower side of the surface-mounted component 40B. The connection terminals 41B or the contact end portion 42B of the components 40B are arranged on and are electrically connected to the contact portions 11B with solder 43B or the like.

The second board 20B is formed of a resinous material and is integrally fastened to the lower face of the first board 10B by an adhesive or the like. Also, as shown in FIG. 8 the second board 20B has land portions 21B formed on its lower face and second through-holes 22B in the land portions 21B. In this case, the second through-holes 22B are held in one-to-one correspondence with the contact portions 11B on the first board 10B. Each conductor pin 23B is integrally mounted in the corresponding second through-hole 22B with solder 24B or by means such as forced fitting.

In the third board 30B which is arranged under the second board 20B, third through-holes 31B are formed at positions corresponding to the respective conductor pins 23B, and the conductor layer 32B is formed on at least one face of this board. Of course, the inner wall of each third through-hole 31B is through-hole plated, so that when the lower end part of the corresponding conductor pin 23B is passed through the third through-hole 31B, the conductor pin 23B becomes electrically continuous wit the third through-hole 31B. The conductor layer 32B is not formed to extend to areas where the conductor pins 23B need not be electrically connected. In cases where continuity between the conductor pins 23B is required, the conductor layer 32B is formed to make the corresponding third through-holes 31B electrically continuous as shown in FIG. 9.

The package 110B in the second embodiment thus constructed has many advantages in surface-mounted techniques. A flat component, for a programmable IC, can be used as the electronic component. The boards need not be subjected to any working requiring complicated steps, such as the formation of contact holes for the electronic component. At the same time, the package can efficiently realize the advantages of packaging techniques employing conductor pins since external connection terminals for the individual components to be surface-mounted 40B need not be formed on the front face side of the package, allowing the front face side to be relatively smooth.

Also, with the package 100B, it is possible to use each conductor pin 23B in a shared fashion, and further, the exchange of the third board 30B is possible, so that the versatility of the package is very high.

Embodiment 3

Figure 10:
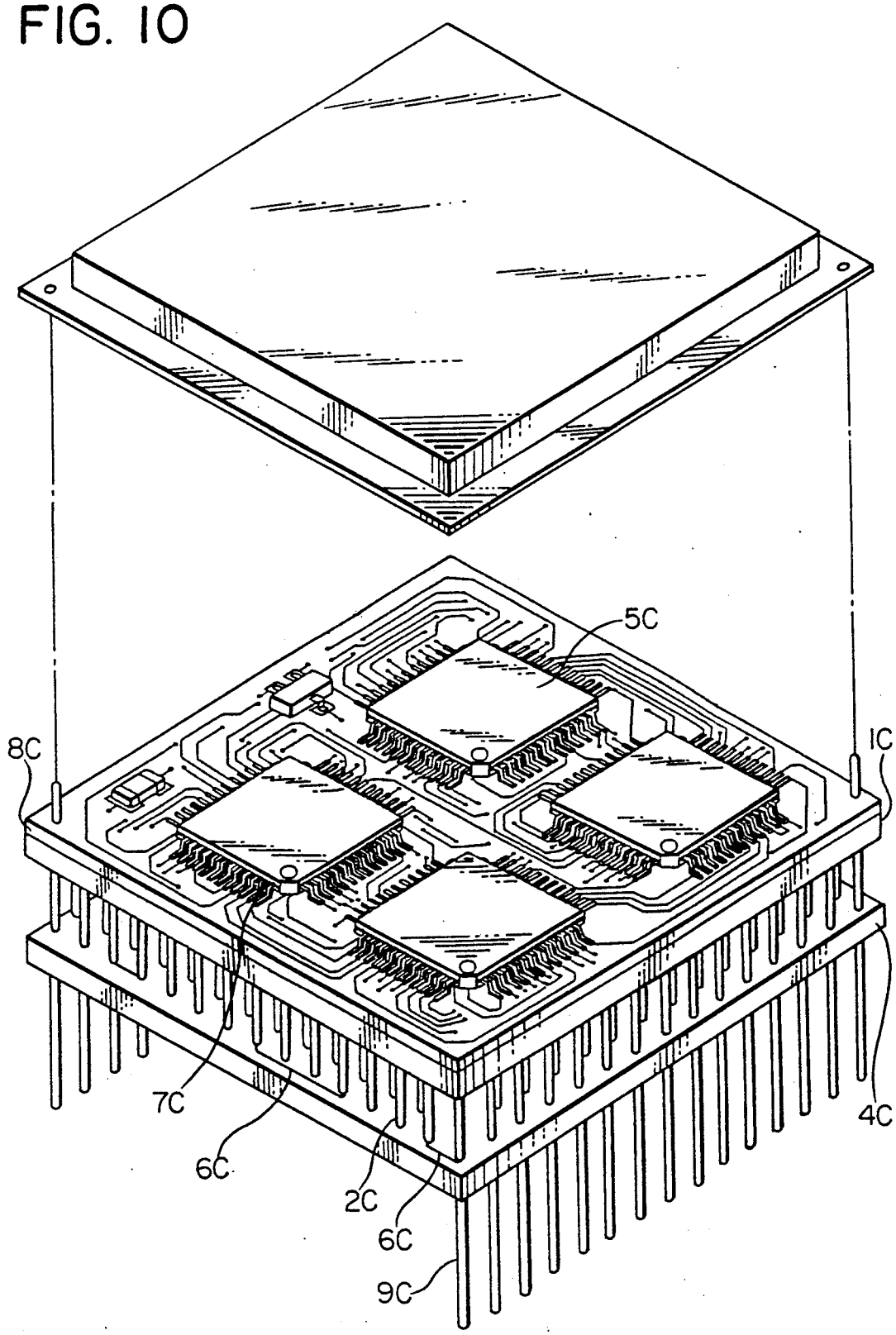
FIG. 10 is a perspective view of a third embodiment of the present invention.

FIG. 10 is a perspective view of a third embodiment of the present invention. Referring to the figure, a standardized package 1C for surface-mounted components is combined with an adapter printed wiring board 4C. Board 4C (a third board) is a double-sided printed wiring board, the outward shape of which and the positions of the through-holes of which are similar to those of the standardized package 1C. First conductor pins 2C which need to be connected with a base printed wiring board 3C (a fourth board, shown in FIGS. 11 and 12) are connected to second conductor pins 9C through conductor circuits 6C on board 4C. On the other hand, first conductor pins 2C which need to be connected with the other pins of the package are connected through the conductor circuits 6C of the adapter printed wiring board 4C. Thus, large scale electronic circuits which cannot be realized using a single surface-mounted component 5C can be put together as a single electronic-circuit block in a package 1C having only external connection pins.

Figure 11:
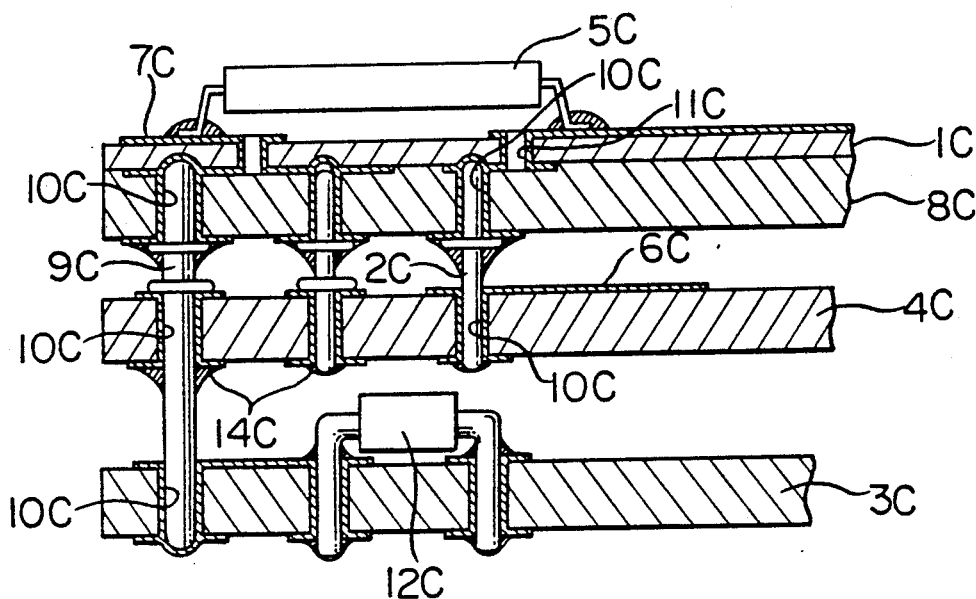
FIG. 11 is a sectional view of the third embodiment.

FIG. 11 is a partial enlarged sectional view schematically showing the construction of package 1C. A printed wiring board 8C has conductor-pin inserting through-holes 10C, which are fourth plated-through through-holes the side walls of which are connected via through-holes 11C to conductor patterns 7C for surface-mounted components. Patterns 7C are formed on the front face side of the printed wiring board 8C. In this way, the first and second conductor pins 2C, 9C are electrically connected to components 5C, here programmable IC's, in one-to-one correspondence. Usually, the first and second conductor pins 2C, 9C are arranged in a grid at a pitch of 0.1 inch, and they are located under the programmable IC's 5C. The first and second conductor pins 2C, 9C of the package 1C thus fabricated in standardized fashion are inserted into the adapter printed wiring board 4C and are fixed with solder 14C. When the adapter printed wiring board 4C is formed beforehand with the conductor patterns or circuits 6C and the conductor-pin mounting through-holes 10C for coupling the desired terminals of the programmable IC's, the necessary terminals can be connected. Further, the conductor pins 2C which need to be connected with the exterior of the package for surface-mounted components can be connected to the second conductor pins 9C by the use of the conductor circuits 6C of the adapter printed wiring board 4C.

Embodiment 4

Figure 12:
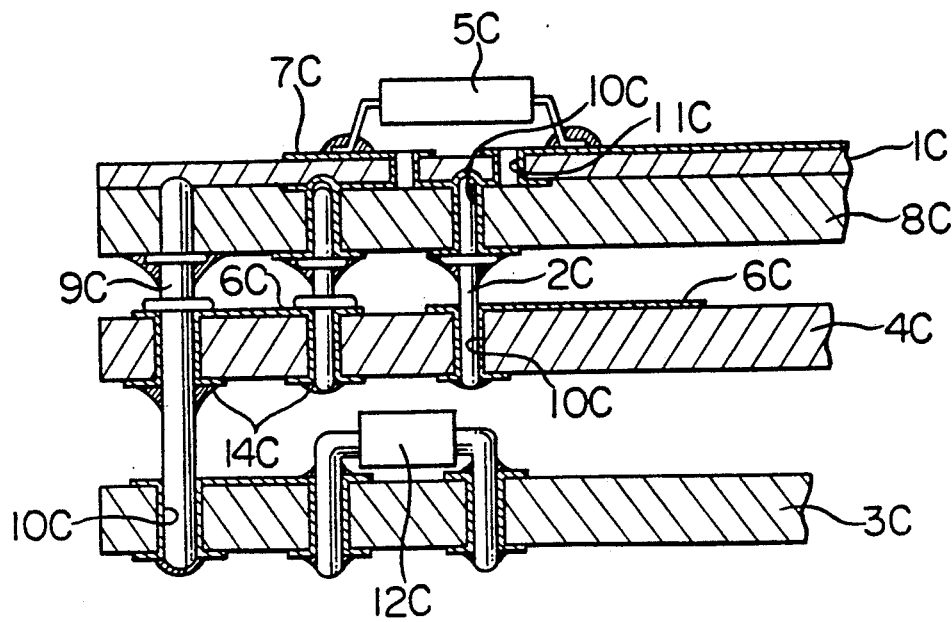
FIG. 12 is a sectional view of a fourth embodiment of the present invention.

FIG. 12 is partial enlarged sectional view schematically showing the construction of a package 1C in the fourth embodiment of a present invention. A printed wiring board 8C has conductor-pin inserting through-holes 10C, the side walls of which are connected via through-holes 11C to conductor patterns 7C for surface-mounted components. Patterns 7C are formed on the front face side of the printed wiring board 8C. In this way, first conductor pins 2C are electrically connected to programmable IC's 5C on the printed wiring board 8C in one-to-one correspondence. On the other hand, second conductor pins 9C which are connected with a base printed wiring board 3C, a fourth board are connected on the adapter printed wiring board 4C to the surface-mounted components 5C, but not on the printed wiring board 8C, in order to increase the versatility of the package 1C. Usually, the conductor pins are arranged in a grid at a pitch 0.1 inch, and they are located under the programmable IC's. The first and second conductor pins 2C, 9C of the package 1C thus fabricated in standardized fashion are inserted into the adapter printed wiring board 4C and are fixed with solder 14C. When the adapter printed wiring board 4C is formed beforehand with conductor circuits 6C and the conductor-pin mounting through-holes 10C for coupling the desired terminals of the programmable IC's, the necessary programmable-IC terminals can be connected. Further, the conductor pins which need to be connected with the exterior of the package can be connected to the second conductor pins 9C by the use of the conductor circuits 6C of the adapter printed wiring board 4C.

When the construction in either of Embodiments 3 or 4 is adopted and a double-sided printed wiring board is standardized as to the positions of the through-holes and the outer shape, a standardized package for surface-mounted components can be used as the conductor-pin connecting adapter printed wiring board. The package can be fabricated at low cost while still maintaining the ability to assemble functional blocks of the electronic circuits. Furthermore, since the number of the conductor pins 9C to be connected to the base printed wiring board 3C is decreased, this base printed wiring board can be effectively utilized as demonstrated by an electronic component 12C shown in FIG. 11 or FIG. 12.

Embodiment 5

Figure 13:
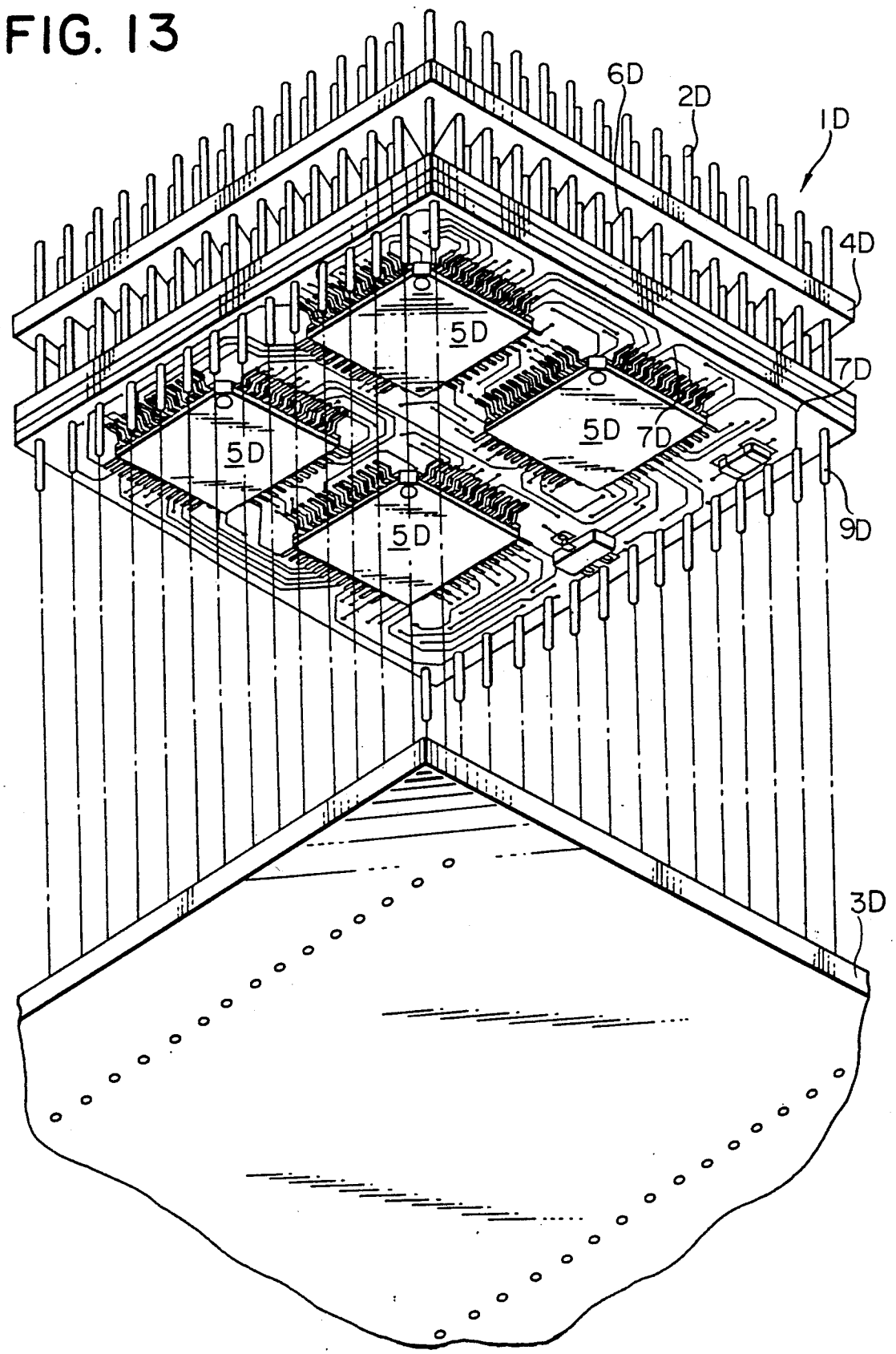
FIG. 13 is a perspective view of a fifth embodiment of the present invention.

FIG. 13 is a perspective view of a package 1D for surface-mounted components in a fifth embodiment of the present invention.

According to this embodiment of FIG. 13, the standardized package 1D is combined with an adapter printed wiring board 4D, a third board. Board 4D is a printed wiring board, the outward shape of which and the positions of the through-holes of which are standardized, similarly to those of the standardized package 1D. First conductor pins 2D which need to be connected to the exterior of the package 1D are connected to second conductor pins 9D through the conductor circuits 6D of the adapter printed wiring board 4D. On the other hand, first conductor pins 2D which need to be connected with the other pins of the package 1D are connected through the conductor circuits 6D of the adapter printed wiring board 4D. Thus, electronic circuits of large scale which cannot be realized by a single programmable IC are packaged in the single package 1D. In this way, only the minimum number of connection pins can be used for the connections with the exterior. Furthermore, it is possible to construct the package 1D furnished with conductor pins by which the signals of the respective blocks within the package 1D are readily monitored.

Figure 14:
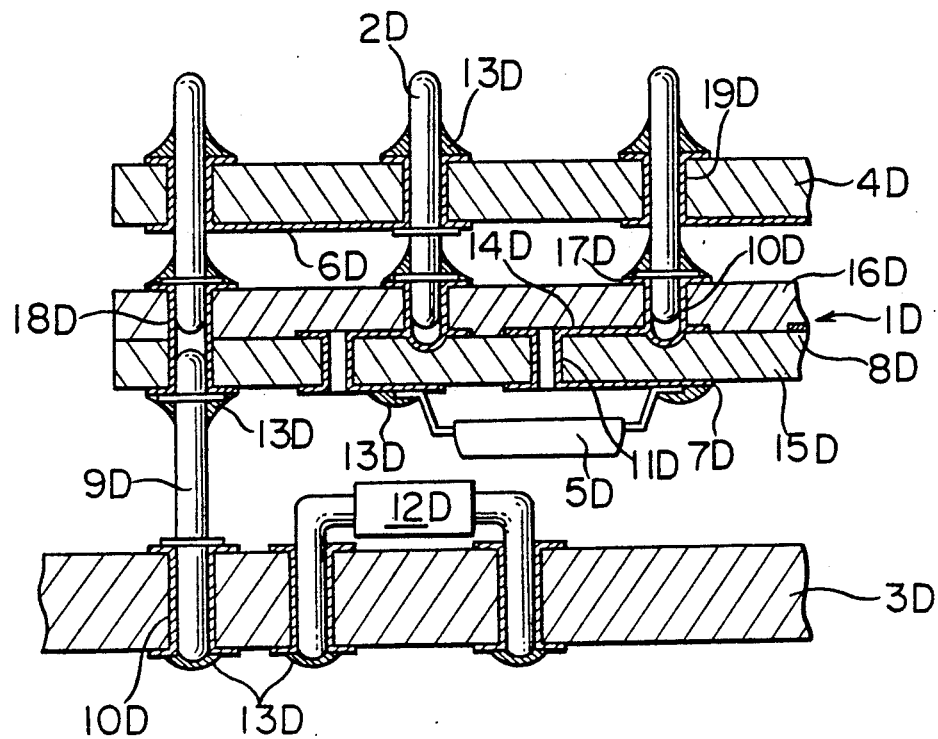
FIGS. 14 - 16 are sectional views of the fifth embodiment.

FIG. 14 shows a part of FIG. 13 in an enlarged sectional view. A printed wiring board 8D has through-holes 10D, fourth plated-through through-holes, for mounting the first and second conductor pins 2D, 9D. The side walls of the through-holes 10D are connected via through-holes 11D to conductor patterns 7D for surface-mounted components. Patterns 7D are formed on the lower face of the printed wiring board 8D. In this way, some of the first conductor pins 2D on the upper side are electrically connected to the connection terminals of the programmable IC's 5D in a one-to-one correspondence. Usually, the first, conductor pins 2D are arranged in a grid at a pitch of 0.1 inch, and they are located over the programmable IC's 5D. The second conductor pins 9D for connecting the package 1D and the exterior are electrically connected with the connection terminals of the programmable IC's 5D through the conductor circuits 6D of the adapter printed wiring board 4D which increases the versatility of the package 1D. The first conductor pins 2D on the upper side of the package for surface-packaged components, 1D thus fabricated in standardized fashion are inserted into the adapter printed wiring board 4D and are soldered. An adapter printed wiring board 4D is standardized as to the positions of the through-holes and the outer shape in the same way as package 1D. Further, board 4D is formed before it is needed with the conductor patterns 6D and conductor-pin mounting through-holes 19D for coupling the desired connection terminals of the programmable IC's 5D.

Figure 15:
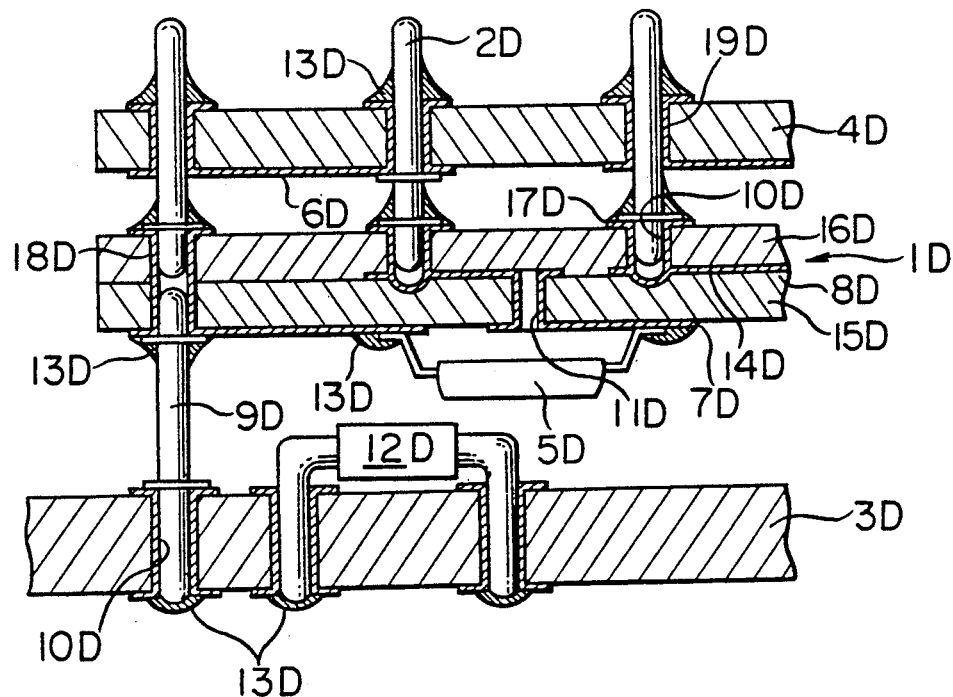

FIG. 15 shows a part of FIG. 13 in an enlarged sectional view. The printed wiring board 8D has the conductor-pin mounting through-holes 10D, the side walls of which are connected via the through-holes 11D to the conductor patterns 7D formed on the lower face of the printed wiring board 8D. In this way, the first conductor pins 2D on the upper side are electrically connected to the connection terminals of the programmable IC's 5D in one-to-one correspondence. Usually, the first conductor pins 2D are arranged in a grid at a pitch of 0.1 inch, and they are located over the programmable IC's 5D. Besides, the second conductor pins 9D for connecting the package 1D to external circuitry are arranged on the lower face in a dual in-line configuration. The first conductor pins 2D on the upper side of the package 1D thus fabricated in standardized fashion are inserted into the adapter printed wiring board 4D and are soldered. The adapter printed wiring board 4D is standardized as to the positions of the through-holes and the outer shape in the same way as the package 1D. Further, board 4D is previously formed with the conductor patterns 6D and the conductor-pin mounting through-holes 19D for coupling the desired connection terminals of the programmable IC's 5D.

Figure 16:
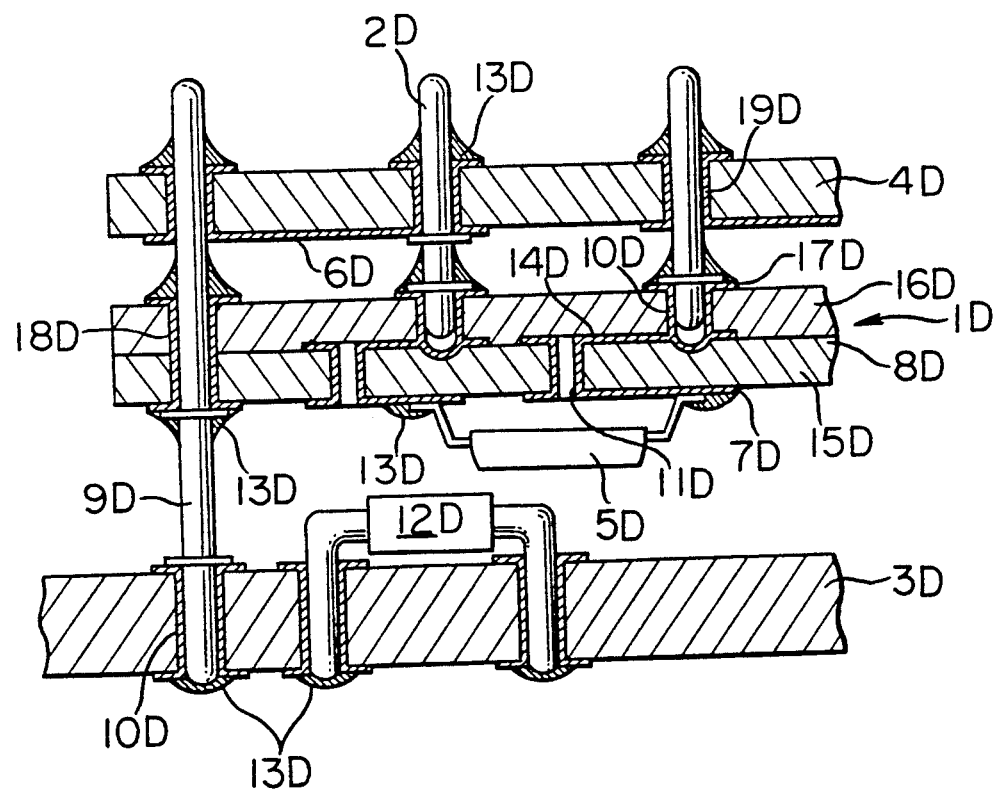

FIG. 16 shows a part of FIG. 13 in an enlarged sectional view. The printed wiring board 8D has the conductor-pin mounting through-holes 10D, the side walls of which are connected via the through-holes 11D to the conductor patterns 7D formed on the lower face of the printed wiring board 8D. In this way, some of the first conductor pins 2D on the upper side are electrically connected to the connection terminals of the programmable IC's 5D in one-to-one correspondence. Usually, the first conductor pins 2D are arranged in a grid at a pitch of 0.1 inch, and they are located over the programmable IC's 5D. The second conductor pins 9D which are not electrically connected to the connection terminals of the programmable IC's 5D function to connect the package 1D and a base printed wiring board 3D, a fourth board. Board 3D is located below board 8D. Pins 9D penetrate the printed wiring board 8D and protrude both above and below the printed wiring board 8D. The first conductor pins 2D on the upper side of the package 1D thus fabricated in standardized fashion are inserted into the adapter printed wiring board 4D and are soldered. The adapter printed wiring board 4D is standardized as to the positions of the through-holes and the outer shape in the same way as the package 1D. Further, it is previously formed with the conductor patterns 6D and the conductor-pin mounting through-holes 9D for coupling the desired connection terminals of the programmable IC's 5D.

Incidentally, the connections between the first and/or second conductor pins 2D, 9D stated above in conjunction with FIGS. 14–16 can be performed with wire wrapping which replaces the use of the adapter printed wiring board 4D.

The package of the fifth embodiment is fabricated according to any of the several modes explained below:

First Mode (Package for surface-mounted components as shown in FIG. 14)

Using an ordinary subtractive process, a glass-epoxy laminated plate covered with copper and having a thickness of 1.0 mm (each of copper foils on both sides being 18 μm thick) was formed with conductor circuits 7D on a programmable-IC packaging face and inner-layer conductor circuits 14D. Through-holes 11D are plated for making them electrically continuous. The double-sided printed wiring board 15D thus obtained and a glass-epoxy laminated plate 16D covered with copper and having a thickness of 0.8 mm (a copper foil on one side being 18 μm thick) were stacked and united by pressing with a glass-epoxy resin prepreg (0.2 mm thick). The inner-layer conductor circuits 14D lie at the interface of united boards, while the programmable-IC packaging face and the copper foil face of the single-sided copper-covered lamination lie at the exposed outside surfaces of the united boards. Hereinbelow, in the multilayer board thus produced, the programmable-IC packaging face is called the "rear face," and the opposite face is called the "front face."

From the front face of the multilayer board, there were provided non-penetrating openings for forming through-holes 10D for mounting conductor pins and penetrating openings for forming through-holes 18D for mounting conductor pins Thereafter the openings were through-hole plated. Further, outer-layer conductor circuits 17D necessary for mounting the first and second conductor pins 2D, 9D were formed by etching. Thus, a multilayer printed wiring board 8D was formed.

The conductor pins 2D, 9D made of Kovar and plated with solder were respectively inserted into and fixed in the conductor-pin mounting through-holes 10D, 18D of the multilayer printed wiring board 8D with a high-melting point solder. Then, the package 1D was fabricated. Incidentally, the first and second conductor pins 2D, 9D were disposed from both the front and rear faces into each of the penetrating openings 18D among the conductor-pin mounting through-holes 10D, 18D.

Thereafter, the programmable IC's 5D were fixed to the contact portions 7D with solder 13D, and necessary programs were entered in the programmable IC's 5D through the conductor pins 2D.

Lastly, a glass-epoxy laminated plate covered with copper and having a thickness of 1.0 mm (each of copper foils on both sides being 18 μm thick) was formed with penetrating openings which correspond to the first conductor pins 2D disposed on the front face of the package 1D, through-holes 19D and conductor circuits 6D for connecting at least some of the first conductor pins 2D were formed by an ordinary subtractive process. The an adapter printed wiring board 4D thus prepared was mounted on and fixed to the first conductor pins 2D disposed on the front face of the package 1D by solder dipping.

In this way, the package for surface-mounted components as shown in FIG. 14 was produced in which the first conductor pins 2D for making connections between the package 1D and external circuitry can be connected to external circuitry through the conductor circuits 6D of the adapter printed wiring board 4D and the second conductor pins 9D of the printed wiring board 8D. Through the conductor pins 2D, the signals of the respective blocks within the package can easily be monitored.

Second Mode (Package for surface-mounted components as shown in FIG. 15)

Using an ordinary process, a glass-triazine laminated plate covered with copper and having a thickness of 1.0 mm (each of copper foils on both sides being 18 μm thick) was formed with conductor circuits 7D on a programmable-IC packaging face and inner-layer conductor circuits 14D, and plated through-holes 11D for making circuits 7D and 14D electrically continuous. The double-sided printed wiring board 15D thus obtained and a glass-triazine laminated plate 16D covered with copper and having a thickness of 0.8 mm (a copper foil on one side being 18 μm thick) were stacked and united by pressing with a glass-triazine resin prepreg (0.2 mm thick) with the inner-layer conductor circuits 14D at the interface and the programmable-IC packaging face and the copper foil face of the single board 16D at the outside. Hereinbelow, in the multilayer board thus produced, the programmable-IC packaging face is called the "rear face," and the opposite face is called the "front face."

At the front face of the multilayer board, there were provided non-penetrating openings and penetrating openings for forming through-holes 10D, 18D for mounting conductor pins 2D. Here, the penetrating openings served also as the conductor-pin mounting through-holes 18D for connecting package 1D with external circuitry and they were arranged in a dual in-line configuration. After masking the rear face as required, the openings were subjected to through-hole plating. Further, outer-layer conductor circuits 17D necessary for mounting the first and second conductor pins 2D, 9D were formed by etching.

The first and second conductor pins 2D, 9D made of nickel-gold plated phosphor bronze were respectively inserted into and fixed in the conductor-pin mounting through-holes 10D, 18D of the multilayer printed wiring board 8D by the use of a solder. Then, the package 1D was fabricated. Incidentally, the first and second conductor pins 2D, 9D were disposed from both the front and rear faces into each of the penetrating openings 18D among the conductor-pin mounting through-holes 10D, 18D.

Thereafter, the programmable IC's 5D were mounted on the contact portions 7D with solder 13D, and necessary programs were entered in the programmable IC's 5D through the conductor pins 2D.

Lastly, a glass-triazine laminated plate covered with copper and having a thickness of 1.0 mm (each of copper foils on both sides being 18 μm thick) was formed with penetrating openings which corresponds to the first conductor pins 2D disposed on the front face of the package 1D. through-holes 19D and conductor circuits 6D for connecting at least some of the first conductor pins 2D were formed by an ordinary semi-additive process. An adapter printed wiring board 4D thus prepared was fixed to the first conductor pins 2D disposed on the front face of the package 1D by solder dipping.

In this way, the package for surface-mounted components as shown in FIG. 15 was produced in which the first conductor pins 2D for making connections between the package 1D and the exterior can be connected to external circuitry through the conductor circuits 6D of the adapter printed wiring board 4D. The second conductor pins 9D of the printed wiring board 8D are electrically connected to the conductor pins 2D for easily monitoring the signals of the respective blocks within the package 1D.

Third Mode (Package for surface-mounted components employing wire wrapping instead of adapter printed wiring board)

Using an ordinary subtractive process, a glass-polyimide laminated plate covered with copper and having a thickness of 1.0 mm (each of copper foils on both sides being 18 μm thick) was formed with conductor circuits 7D on a programmable-IC packaging face and inner-layer conductor circuits 14D on an opposite face. Plated through-holes 11D make circuits 7D and 14D electrically continuous. The double-sided printed wiring board 15D thus obtained and a glass-polyimide laminated plate covered with copper and having a thickness of 0.8 mm (a copper foil on one side being 18 μm thick) were stacked and united by pressing through a glass-polyimide resin prepreg (0.2 mm thick) with the inner-layer conductor circuits 14D at the interface and programmable-IC packaging face and the copper foil face of board 16D at the outside of the package. Hereinbelow, in the multilayer board thus produced, the programmable-IC packaging face is called the "rear face is called," and the opposite face the "front face."

From the front face of the multilayer board, there were provided non-penetrating openings for forming through-holes 10D for mounting conductor pins and penetrating openings for forming through-holes 18D for mounting conductor pins for connecting the package 1D to external circuitry. The penetrating openings were arranged in a dual in-line configuration. After masking the rear face as required, the openings were through-hole plated. Further, conductor circuits 17D necessary for mounting the first and second conductor pins 2D, 9D were formed by etching. Thus, a multilayer printed wiring board 8D was formed.

The first and second conductor pins 2D, 9D made of phosphor bronze and plated with solder were respectively mounted in and fixed in the conductor-pin mounting through-holes 10D, 18D of the multilayer printed wiring board 8D by dipping in a high-melting point solder. Thus, the package 1D was fabricated. Incidentally, the second conductor pins 9D were inserted form the rear face of the multilayer printed wiring board 8D into the penetrating openings 18D of the conductor-pin mounting through-holes 10D, 18D, and were fixed in place with a solder 13D.

Thereafter, the programmable IC's 5D were mounted on to the contact portions 7D with the solder 13D, and necessary programs were entered in the programmable IC's 5D through the conductor pins 2D.

In this way, the package for surface-mounted components was obtained in which the first conductor pins 2D for connecting the package ID to external circuitry were connected to the second conductor pins 9D of the printed wiring board 8D by wire wrapping. COnductor pins 2D may be used for easily monitoring the signals of the respective blocks within the package 1D.

When the construction of Embodiment 5 described above is adopted and the double-sided adapter printed wiring board 4D is standardized as to the positions of the through-holes and the outward shape with the package for surface-mounted components, the function blocks of the electronic circuits are easily put together and the package can be fabricated at low cost. Further, since the number of the conductor pins to be connected to the base printed wiring board 3D is decreased, this base printed wiring board 3D can be effectively utilized to mount an electronic component 12D as shown in any of FIGS. 14–16. Still further, the conductor pins 2D for readily monitoring the signals of the respective blocks within the package 1D can be provided.

What is claimed is:

1. An integral package for mounting surface-mounted electronic components and for establishing electrical connections with external circuitry comprising:

a first board having opposed front and rear faces including electrically conducting contact portions disposed on said front face thereof for mounting surface-mounted components and first plated-through through-holes extending through said first board wherein the first plated-through through-holes are electrically connected to respective ones of said contact portions;

a second board having opposed front and rear faces including second plated-through through-holes and electrically conducting pins disposed in the second plated-through through-holes in electrical contact with the respective second plated-through through-holes and protruding from said rear face of said second board for establishing electrical connections to external circuitry; and an electrically conducting layer interposed between and in contact with said rear face of said first board and said front face of said second board which electrically connects respective ones of the first plated-through through-holes on the first board with corresponding ones of the second plated-through through-holes on said second board, wherein said first board, said electrically conducting layer, and said second board are bonded together as an integral unit and the first plated-through through-holes are laterally displaced in said package from the respective electrically connected second plated-through through-holes.

2. An integral package for mounting surface-mounted electronic components and for establishing electrical connections with external circuitry comprising:

a first board having opposed front and rear faces including electrically conducting contact portions disposed on said front face thereof for mounting surface-mounted components and first plated-through through-holes extending through said first board wherein the first plated-through through-holes are electrically connected to respective contact portions;

a second board having opposed front and rear faces including second plated-through through-holes and electrically conducting pins disposed in the second plated-through through-holes, in electrical contact with the second plated-through through-holes, and protruding from said rear face of said second board for establishing electrical connections to external circuitry;

an electrically conducting layer interposed between and in contact with said rear face of said first board and said front face of said second board which electrically connects respective first plated-through through-holes on the first board with corresponding second plated-through through-holes on said second board, wherein said first board, said electrically conducting layer, and said second board are bonded together as an integral unit and the first plated-through through-holes are laterally displaced in said package for the respective electrically connected second plated-through through-holes; and a third board disposed opposite and spaced from said rear face of said second board including third plated-through through-holes receiving respective conducting pins and a second electrically conducting layer disposed on said third board electrically connecting respective third plated-through through-holes establishing electrical continuity between selected contact portions on said first board.

3. The package of claim 3 including programmable integrated circuits surface-mounted on said contact portions.

4. An integral package for mounting surface-mounted electronic components and for establishing electrical connections with external circuitry comprising:

a first board having opposed front and rear faces including electrically conducting contact portions disposed on said front face for mounting surface-mounted components and first plated-through through-holes extending through said first board wherein the first plated-through through-holes are electrically connected to respective contact portions;

a second board having opposed front and rear faces including second plated-through through-holes and electrically conducting pins disposed in the second plated-through through-holes, in electrical contact with the second plated through through-holes, and protruding form said rear face of said second board for establishing electrical connections to external circuitry;

an electrically conducting layer interposed between and in contact with said rear face of said first board and said front face of said second board which electrically connects respective first plate-through through-holes on said first board with corresponding second plated-through through-holes on said second board, wherein said first board, said electrically conducting layer, and said second board are bonded together as an integral unit and the first plated-through through-holes are laterally displaced in said package from the respective electrically connected second plated-through through-holes;

a third board disposed opposite and spaced from said rear face of said second board including third plated-through through-holes receiving respective conducting pins and a second electrically conducting layer disposed on said third board electrically connecting respective third plated-through through-holes establishing electrical continuity with selected contact portions on said first board;

at least one second electrically conducting pin disposed in at least one first plated-through through-hole in said first board, in electrical contact with the first plated-through through-hole, and protruding from said front face of said first board; and a fourth board disposed opposite and spaced from said front face of said first board including fourth plated-through through-holes receiving said at least one second electrically conducting pin and establishing electrical continuity with selected contact portions on said first board.

5. The package of claim 4 including programmable integrated circuits surface-mounted on said contact portions.

6. The package of claim 4 wherein at least one of said second electrically conducting pins is integral with and penetrates said first, second, third, and fourth boards at corresponding through-holes.

7. An integral package for mounting surface-mounted electronic components and for establishing electrical connections with external circuitry comprising:

a first board having opposed front and rear faces including electrically conducting contact portions disposed on said front face for mounting surface-mounted components and first plated-through through-holes extending through said first board wherein the first plated-through through-holes are electrically connected to respective contact portions;

a second board having opposed front and rear faces including second plated-through through-holes and electrically conducting pins disposed in the second plated-through through-holes, in electrical contact with the second plated-through through-holes, and protruding from said rear face of said second board for establishing electrical connections to external circuitry;

an electrically conducting layer interposed between and in contact with said rear face of said first board and said front face of said second board which electrically connects respective first plated-through through-holes on the first board with corresponding second plated-through through-holes on said second board, wherein said first board, said electrically conducting layer, and said second board are bonded together as an integral unit and the first plated-through through-holes are laterally displaced in said package form the respective electrically connected second plated-through through-holes; and a third board disposed opposite and spaced from said rear face of said second board including third plated-through through-holes receiving respective conducting pins establishing electrical continuity with selected contact portions on said first board.

8. The package of claim 7 including a fourth board disposed opposite and spaced from said front face of said first board, said fourth board including fourth plated-through through-holes receiving a conducting pin; and at least one second electrically conducting pin disposed in said first and fourth plated-through through-holes and in electrical contact with said third and fourth plated-through through-holes supporting said fourth board and establishing electrical continuity with selected contact portions on said first board.

9. The package of claim 7 including a fourth board disposed opposite and spaced from said third board, said third board being disposed between said second board and said fourth board, said fourth board including fourth plated-through through-holes for receiving a conducting pin; and a second electrically conducting pin disposed in said third and fourth plated-through through-holes and in electrical contact with said third and fourth plated-through through-holes supporting said fourth board and establishing electrical continuity with selected contact portions of said first board.

10. The package of claim 9 including programmable integrated circuits surface-mounted on said contact portions.

* * * * *